(12) United States Patent
Nayfeh et al.

(10) Patent No.: US 6,984,842 B1
(45) Date of Patent: Jan. 10, 2006

(54) SILICON NANOPARTICLE FIELD EFFECT TRANSISTOR AND TRANSISTOR MEMORY DEVICE

(75) Inventors: Munir H. Nayfeh, Urbana, IL (US);
Joel Therrien, Urbana, IL (US);
Gennadiy Belmoin, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 09/496,506

(22) Filed: Feb. 2, 2000

Related U.S. Application Data

(63) Continuation-in-part of application No. 09/426,204, filed on Oct. 25, 1999, now Pat. No. 6,597,496.

(51) Int. Cl.
*H01L 29/06* (2006.01)
(52) U.S. Cl. .......................... 257/14; 257/27
(58) Field of Classification Search ........... 257/14, 257/27
See application file for complete search history.

(56) References Cited

U.S. PATENT DOCUMENTS

| | | | |
|---|---|---|---|
| 3,597,624 A | 8/1971 | Weiner et al. | |
| 4,931,692 A | 6/1990 | Takagi et al. | |
| 5,308,804 A | 5/1994 | Lee | 501/17 |
| 5,527,386 A | 6/1996 | Statz | 106/481 |
| 5,537,000 A | 7/1996 | Alivisatos et al. | |
| 5,561,679 A | 10/1996 | Mannik et al. | 372/43 |
| 5,690,807 A | 11/1997 | Clark, Jr. et al. | 205/655 |
| 5,695,617 A | 12/1997 | Graiver et al. | 204/157.41 |
| 5,703,896 A * | 12/1997 | Pankove et al. | 372/50 |
| 5,714,766 A * | 2/1998 | Chen et al. | 257/17 |
| 5,747,180 A | 5/1998 | Miller et al. | |
| 5,770,022 A | 6/1998 | Chang et al. | 204/164 |
| 5,881,200 A | 3/1999 | Burt | |
| 5,891,548 A | 4/1999 | Graiver et al. | 428/98 |
| 5,906,670 A | 5/1999 | Dobson et al. | |
| 5,932,889 A * | 8/1999 | Matsumura et al. | 257/14 |
| 5,942,748 A | 8/1999 | Russell et al. | 250/214.1 |
| 6,060,743 A | 5/2000 | Sugiyama et al. | 257/321 |
| 6,326,311 B1 | 12/2001 | Ueda et al. | |
| 6,407,424 B2 * | 6/2002 | Forbes | 257/315 |

FOREIGN PATENT DOCUMENTS

EP 0354141 2/1990

OTHER PUBLICATIONS

Tiware, S., et al., "A silicon nanocrystals based memory," Appl. Phys. Lett. 68(10), Mar. 4, 1996, pp 1377-79.*

(Continued)

*Primary Examiner*—Sara Crane
(74) *Attorney, Agent, or Firm*—Greer, Burns & Crain, Ltd.

(57) ABSTRACT

A silicon nanoparticle transistor and transistor memory device. The transistor of the invention has silicon nanoparticles, dimensioned on the order of 1 nm, in a gate area of a field effect transistor. The resulting transistor is a transistor in which single electron flow controls operation of the transistor. Room temperature operation is possible with the novel transistor structure by radiation assistance, with radiation being directed toward the silicon nanoparticles to create necessary holes in the quantum structure for the flow of an electron. The transistor of the invention also forms the basis for a memory device. The device is a flash memory device which will store electrical charge instead of magnetic effects.

11 Claims, 6 Drawing Sheets

OTHER PUBLICATIONS

J.L. Heinrich, C.L. Curtis, G.M. Credo, K.L. Kavanagh, M.J. Sailor, "Luminescent Colloidal Silicon Suspensions from Porous Silicon", *Science*, vol. 255, Jan. 3, 1992, pp. 66-68.

E. Werwa, A.A. Seraphin and K.D. Kolenbrander, *Excitation Intensity and Temperature Dependent Photoluminescence Behavior of Silicon Nanoparticles*, Material Research Society Symposium Proceedings, vol. 452 pp. 129-134, 1997.

R.W. Collins, P.M. Fauchet, I. Shimizu, J.C. Vial, T. Shimada and A.P. Alivisatos, *Luminescence Properties of Silicon Nanocrystals*, Advances in Microcrystalline and Nanocrystaline Semiconductor Symposium, Boston, MA, USA, Dec. 2-6, 1996 (abstract).

Shoutian Li, Stuart J. Silvers and M. Samy El-Shall, *Luminescence Properties of Silicon Nanocrystals*, Material Research Society Symposium Proceedings, vol. 452, pp. 141-146, 1997.

Kouichi Murakami and Tetsuya Makimura, *Silicon nanoparticles with visible light emission —Laser ablation—*, Oyo Buturi, vol. 67, No. 7, pp. 817-821, Jul. 1998 (with verified translation).

U.S. Appl. No. 09/781,147, filed Feb. 9, 2001, Nayfeh et al., entitled Silicon Nanoparticle Electronic Switches.

U.S. Appl. No. 09/572,121, filed May 17, 2000, Nayfeh et al., entitled Silicon Nanoparticle Microcrystal Nonlinear Optical Devices.

U.S. Appl. No. 09/426,389, filed Oct. 22, 1999, Nayfeh et al., entitled Silicon Nanoparticle and Method for Producing the Same.

U.S. Appl. No. 09/426,204, filed Oct. 25, 1999, Nayfeh et al., entitled Silicon Nanoparticle Stimulated Emission Devices.

S. T. Yau, D. Saltz, M. H. Nayfeh, "Laser-Assisted Deposition of Nanometer Structures Using Scanning Tunneling Microscopy", *Appl. Phys. Lett.*, vol. 57, No. 27, Dec. 31, 1990, pp. 2913-2915.

S.T. Yau, X. Zheng, M.H. Nayfeh, "Nanolithography of Chemically Prepared Si With a Scanning Tunneling Microscope", *Appl. Phys. Lett.*, vol. 59, No. 19, Nov. 4, 1991, pp. 2457-2459.

M. Nayfeh, "Fabrication of Nanometer Scale Structures", SPIE Institutes, vol. IS 10, (1993), pp. 200-217.

D. Andsager, J. Hilliard, J.M. Hetrick, L.H. AbuHassan, M. Plisch, M.H. Nayfeh, "Quenching of Porous Silicon Photoluminescence by Deposition of Metal Adsorbates", *J. Appl. Phys.*, vol. 74, No. 7, Oct. 1, 1993, pp. 4783-4785.

J. Hillard, D. Andsager, L. Abu Hassan, H.M. Nayfeh, M. H. Nayfeh, "Infrared Spectroscopy and Secondary Ion Mass Spectrometry of Luminescent, Nonluminescent and Metal Quenched Porous Silicon", *J. Appl. Phys.*, vol. 76, No. 4, Aug. 15, 1994, pp. 2423-2428.

D. Andsager, J. Hilliard, M.H. Nayfeh, "Behavior of Porous Silicon Emission Spectra During Quenching by Immersion in Metal Ion Solutions", *Appl. Phys. Lett.*, vol. 64, No. 9, Feb. 28, 1994, pp. 1141-1143.

D. Andsager, J.M. Hetrick, J. Hilliard, M.H. Nayfeh, "Diffusion of Copper in Porous Silicon", *J. of Appl. Phys.*, vol. 77, No. 9, May 1, 1995, pp. 1-4.

J.E. Hilliard, H.M. Nayfeh, M.H. Nayfeh, "Re-Establishment of Photoluminescence in Cu Quenched Porous Silicon by Acid Treatment", *J. App. Phys.*, vol. 77, No. 8, Apr. 15, 1995, pp. 4130-4132.

N. Rigakis, J. Hillard, L. Abu Hassan, J. Hetrick, D. Andsager, M.H. Nayfeh, "Effect of Oxidation Treatments on Photoluminescence Excitation of Porous Silicon", *J. App. Phys.*, vol. 81, No. 8, Jan. 1, 1997, pp. 440-444.

N. Rigagis, Z. Yamani, L. Abu Hassan, J. Hilliard, M.H. Nayfeh, "Time-Resolved Measurements of the Photoluminescence of Cu-Quenched Porous Silicon", *Appl. Phys. Lett.*, vol. 69, 1996, pp. 2216-2218.

W.H. Thompson, Z. Yamani, L.H. Abu Hassan, J.E. Greene, M. Nayfeh, "Room Temperature Oxidation Enhancement of Porous Si(001) Using Ultraviolet-Ozone Exposure", *J. Appl. Phys.*, vol. 80, No. 9, Nov. 1, 1996, pp. 5415-5421.

Z. Yamani. W.H. Thompson, L. Abu Hassan, M.H. Nayfeh, "Ideal Anodization of Silicon", *Appl. Phys. Lett.*, vol. 70, No. 25, Jun. 23, 1997, pp. 3404-3406.

M.H. Nayfeh, N. Rigakis, Z. Yamani, "Photoexcitation of Si-Si Surface States in Nanocrystallites", *Physical Review B*, vol. 56, No. 4, Jul. 15, 1997, pp. 2079-2084.

Z. Yamani, S. Ashhab, A. Nayfeh, W.H. Thompson, M. Nayfeh, "Red to Green Rainbow Photoluminescence from Unoxidized Silicon Nanocrystallites", *J. Appl. Phys.*, vol. 83, No. 7, Apr. 1, 1998, pp. 3929-3931.

Z. Yamani, N. Rigakis, M.H. Nayfeh, "Excitation of Size Selected Nanocrystallites in Porous Silicon", *Appl. Phys. Lett.*, vol. 72, No. 20, May 18, 1998, pp. 2556-2558.

W.H. Thompson, Z. Yamani, L. Abu Hassan, O. Gurdal, M. Nayfeh, "The Effect of Ultrathin Oxides on Luminescent Silicon Nanocrystallites", *Appl. Phys. Lett.*, vol. 73, No. 6, Aug. 10, 1998, pp. 841-843.

M.H. Nayfeh, N. Rigakis, Z. Yamani, "Photoexcitation of Si-Si Radiative Surface States in Nanocrystallites", Mater. Res. Soc. Proc., Boston, MA, 1997.

M.H. Nayfeh, Z. Yamani, O. Gurdal, A. Alaql, "Nanostructure of Porous Silicon using Transmission Microscopy", Mater. Res. Soc. Proc., Boston, MA, 1998.

Z. Yamani, A. Alaql, J. Therrien, O. Nayfeh, M. Nayfeh, "Revival of Interband Crystallite Reflectance from Nanocrystallites in Porous Silicon by Immersion Plating", *Appl. Phys. Lett.*, vol. 74, No. 23, Jun. 7, 1999, pp. 3483-3485.

Z. Yamani, O. Gurdal, A. Alaql, M.H. Nayfeh, "Correlation of Diffuse Scattering with Nanocrystallite Size in Porous Silicon Using Transmission", *J. Appl. Phys.*, vol. 85, No. 12, Jun. 15, 1999, pp. 8050-8053.

L.T. Canham, "Silicon Quantum Wire Array Fabrication by Electrochemical and Chemical Dissolution of Wafers", *Appl. Phys. Lett.*, vol. 57, No. 10, Sep. 3, 1990, pp. 1046-1048.

A.G. Cullis, L.T. Canham, P.D.J. Calcott, "The Structural and Luminescense Properties of Porous Silicon", *J. Appl. Phys.*, vol. 82, No. 3, Aug. 1, 1997, pp. 909-965.

J. Wang, H.B. Jiang, W.C. Wang, J.B. Zheng, F.L. Zhang, P.H. Hao, X.Y Hou, X. Wang, "Efficient Infrared-Up- 22, Conversion Luminescence in Porous Silicon: A Quantum-Confinement-Induced Effect", *Phys. Rev. Lett.*, vol. 69, No. Nov. 30, 1992, pp. 3252-3255.

J. Gole, D. Dixon, "Evidence for Oxide Formation from the Single and Multiphoton Excitation of a Porous Silicon Surface or Silicon 'Nanoparticles'", *J. Appl. Phys.*, vol. 83, No. 11, Jun. 1, 1998, pp. 5985-5991.

F. Koch, "Models and Mechanisms for the Luminescence of Porous Si", Mater. Res. Soc. Symp. Proc., pp. 319-329.

R.P. Chin, Y.R. Shen, V. Petrova-Koch, "Photoluminescence from Porous Silicon by Infrared Multiphoton Excitation" *Science*, vol. 270, Nov. 3, 1995, pp. 776-778.

S.I. Raider, R. Flitsch, M.J. Palmer, "Oxide Growth on Etched Silison in Air at Room Temperature", *J. Electrochem. Soc.*, vol. 122, No. 3, Mar. 1975, pp. 413-418.

U. Neuwald, A. Feltz, U. Memmert, R.J. Behm, "Chemical Oxidation of Hydrogen Passivated Si(111) Surfaces in $H_2O_2$", *J. Appl. Phys.*, vol. 78, No. 6, Sep. 15, 1995, pp. 4131-4136.

A. Pasquarello, M.S. Hybertsen, R. Car, "Si 2p Core-Level Shifts at the Si(001)-$SiO_2$ Interface: A First-Principles Study", *Phys. Rev. Lett.*, vol. 74, No. 6, Feb. 6, 1995, pp. 1024-1027.

M.H. Nayfeh, N. Rigakis, Z. Yamani, "Photoexcitation of Si-Si Radiative Surface States in Nanocrystallites", Mat. Res. Soc. Symp. Proc., vol. 486, pp. 243-248.

E. Hanamura, "Very Large Optical Nonlinearity of Semiconductor Microcrystallites", *Physical Rev. B*, vol. 37, No. 3, Jan. 15, 1988, pp. 1273-1279.

G. Allan, C. Delerue, M. Lannoo, "Nature of Luminescence Surface States of Semiconductor Nanocrystallites", *Physical Rev. Lett.*, vol. 76, No. 16, Apr. 15, 1996, pp. 2961-2964.

G.M. Credo, M.D. Mason, and S.K. Buratto, "External quantum efficiency of single porous silicon nanoparticles", Applied Physics Letters, vol. 74, No. 14, Apr. 5, 1999, pp. 1978-1980.

D.J. DiMaria, J.R. Kirtley, E.J. Pakulis, D.W. Dong, T.S. Kuan, F.L. Pesavento, T.N. Theis, J.A. Cutro, and S.D. Brorson, "Electroluminescence studies in silicon dioxide films containing tiny silicon islands", J. Appl. Phys., vol. 56, No. 2, Jul. 15, 1984, pp. 401-416.

S. Juen, K. Überbacher, J. Baldauf, K.F. Lamprecht, R. Tessadri, R. Lackner, R.A. Höpfel, "Technology and Photoluminescence of GaAs Micro- and Nanocrystallites", Superlattices and Microstructures, vol. 11, No. 2, 1992, pp. 181-184.

K.A. Littau, P.J. Szajowski, A.J. Muller, A.R. Kortan, and L.E. Brus, "A Luminescent Silicon Nanocrystal Colloid via a High-Temperature Aerosol Reaction", The Journal of Physical Chemistry, vol. 97, No. 6, 1993, pp. 1224-1230.

Anton Fojtik, Arnim Henglein, "Luminescent colloidal silicon particles", Chemical Physics Letters 221, Apr. 29, 1994, pp. 363-367.

L.A. Chiu, A.A. Seraphin, and K.D. Kolenbrander, "Gas Phase Synthesis and Processing of Silicon Nanocrystallites: Characterization by Photoluminescence Emission Spectroscopy", Journal of Electronic Materials, vol. 23, No. 3, 1994.

Xinwei Zhao, Olaf Schoenfeld, Jun-ichi Kusano, Yoshinobu Aoyagi and Takuo Sugano, "Observation of Direct Transitions in Silicon Nanocrystallites", Jpn. J. Appl. Phys., vol. 33, Jul. 1, 1994, Pt. 2, No. 7A, pp. L899-L901.

J. Erland, P. Yu, S.I. Bozhevolnyi, J.M. Hvam, N.N. Ledentsov, "Second harmonic spectroscopy of semiconductor nanostructures", Quantum Electronics and Laser Science Conference Technical Digest, May 1999, pp. 233-234.

L. Pavesl, L. Dal Negro, C. Mazzoleni, G. Franzo and F. Prlolo, "Optical gain in silicon nanocrystals", Nature, vol. 408, Nov. 23, 2000, pp. 440-443.

Shoutian Li, I.N. Germanenko, M.S. El Shall, "Semiconductor nanoparticles in contact: quenching of the photoluminescence from silicon nanocrystals by WO3 nanoparticles suspended in solution", Journal of Physical Chemistry B, vol. 102, No. 38, pp. 7319-7322, Sep. 17, 1998 (Abstract).

Tetsuya Makimura, Yasuhiko Kunii and Kouichi Murakami, "Light Emission from Nanometer-Sized Silicon Particles Fabricated by the Laser Ablation Method", Jpn. J. Appl. Phys., vol. 35, (1996), pp. 4780-4784.

M.L. Brongersma, K.S. Min, E. Boer, T.Tambo, A. Polman, and H.A. Atwater, "Tailoring the Optical Properties of Si Nanocrystals in $SiO_2$: Materials Issues and Nanocrystal Laser Perspectives", Mat. Res. Soc. Symp. Proc., vol. 486, 1998 Materials Research Society, pp. 213-217.

L.E. Brus, P.F. Szajowski, W.L. Wilson, T.D. Harris, S. Schuppler, and P.H. Citrin, "Electronic Spectroscopy and Photophysics of Si Nanocrystals: Relationship to Bulk c-Si and Porous Si", J. Am. Chem. Soc., 1995, vol. 117, pp. 2915-2922.

M. Nayfeh, O. Akcakir, J. Therrien, Z. Yamani, N. Barry, W. Yu, and E. Gratton, "Highly Nonlinear photoluminescence threshold in porous silicon", Applied Physics Letters, vol. 75, No. 26, Dec. 27, 1999, pp. 4112-4113.

Gennadiy Belomoin, Joel Therrien, and Munir Nayfeh, "Oxide and hydrogen capped ultrasmall blue luminescent Si nanoparticles", Applied Physics Letters, vol. 77, No. 6, Aug. 7, 2000, pp. 779-780.

Fujii, M., Hayashi, S., Yamamoto, K., "Photoluminescence from B-Doped Si Nanocrystals," Journal of Applied Physics, American Institute of Physics, New York, vol. 83, No. 12, Jun. 15, 1998, pp. 7953-7957.

Levoska, J., Tyunina, M., Leppävuori, S., "Laser Ablation Deposition of Silicon Nanostructures," NanoStructured Materials, Elsevier, New York, Published Online Oct. 6, 1999, pp. 101-106.

Brus, L., "Luminescence of Silicon Nanocrystals and Porous Silicon," Japanese Journal of Applied Physics, Publication Office Japanese Journal of Applied Physics, Tokyo, JP, vol. 34, No. 34-1, Suppl., Jan. 1994, pp. 5-7.

* cited by examiner

SILICON NANOPARTICLE FIELD EFFECT TRANSISTOR AND TRANSISTOR MEMORY DEVICE

REFERENCE TO RELATED APPLICATION

This application is a continuation-in-part application of prior application to Nayfeh et al., Ser. No. 09/426,204, now U.S. Pat. No. 6,597,496, issued Jul. 22, 2003, entitled SILICON NANOPARTICLE STIMULATED EMISSION DEVICES, filed on Oct. 25, 1999 now U.S. Pat. No. 6,597,496.

FIELD OF THE INVENTION

The present invention concerns transistors. More particularly, the invention concerns single electron technology transistors, being transistors in which one-by-one transport of electrons controls device operation.

INCORPORATION BY REFERENCE OF COMMONLY OWNED RELATED APPLICATION

A co-pending and commonly owned application to Nayfeh et al., Ser. No. 09/426,389, entitled SILICON NANOPARTICLES AND METHOD FOR PRODUCING THE SAME, filed on Oct. 22, 1999, is incorporated by reference herein.

BACKGROUND OF THE INVENTION

Transistors are the basic building block of electronic devices. The power of a transistor depends, in large part, on its switching speed and its power requirements. Faster switching transistors offer improved performance. Transistors having lower power requirements offer energy conservation and reduced heating. The latter effects are especially important in devices which rely upon self contained power sources.

The power required to switch a transistor is a function of the amount of current necessary to cause device operation. Much research has been conducted in an effort to reduce the amount of current. The end goal is a device in which operation is caused by a single electron. In single electronics (single electron technology), device operation is based on the concept of one carrier for one bit of information. That is, it is based on one-by-one manipulation of electrons through a small sub-structure, and specifically a transistor.

American researchers first made a transistor that relies on a single electron about fifteen years ago, employing techniques used to make advanced semiconductor chips. They also built a single electron device in which a semiconductor substrate is coated with a thin layer of an insulating material and sprayed minute blobs of indium onto it. They then positioned the tip of a scanning tunneling microscope over it. By manipulating the voltages applied to the tip and the substrate, the researchers controlled the movement of single electrons in and out of the blob. A challenging problem for room temperature operation of such devices is that of thermal fluctuations.

So far, reasonably long range quantum effects on transport properties have been mostly observed near liquid helium/liquid nitrogen temperatures. An important step in the practical development of the single electron devices is therefore the ability to produce operation at higher temperatures, e.g., room temperatures. Thus, there is a need for an improved device in which operation of the device is controlled by the flow of an electron. It is an object of the invention to provide such an improved device, in the form of a silicon nanoparticle field effect transistor.

SUMMARY OF THE INVENTION

The present invention concerns a transistor including silicon nanoparticles. Silicon nanoparticles are a previously unknown material. The silicon nanoparticles and a method for making the same are described in co-pending application Ser. No. 09/426,204, to Nayfeh et al. entitled SILICON NANOPARTICLE STIMULATED EMISSION DEVICES, which is incorporated by reference herein.

In a preferred embodiment, the silicon nanoparticles occupy a gate region of the transistor. The resulting transistor is a transistor in which single electron flow controls operation of the transistor. Room temperature operation is possible with the novel transistor structure by radiation assistance, with radiation being directed toward the silicon nanoparticles to create necessary holes in the quantum structure for the flow of an electron.

The transistor of the invention also forms the basis for a memory device. The device is a flash memory device which will store electrical charge instead of magnetic effects.

BRIEF DESCRIPTION OF THE DRAWINGS

Other features, objects, and advantages of the invention will be apparent by reference to the detailed description and the drawings, of which.

DETAILED DESCRIPTION OF THE INVENTION

Figure 1:
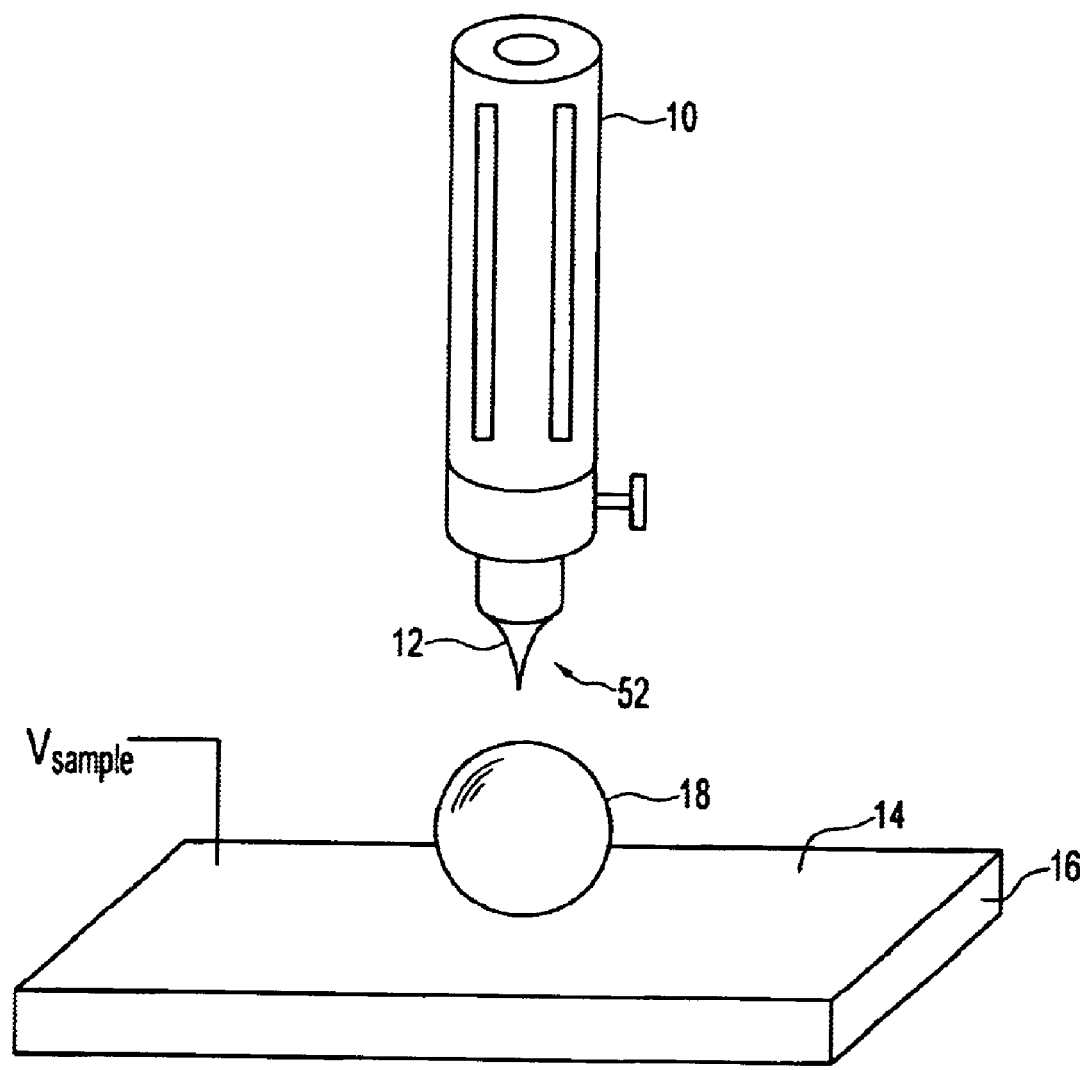
FIG. 1 depicts an experimental configuration where the tip of a scanning tunneling microscope is placed over a film material at a constant height to simulate a two terminal device.

The present invention concerns single electron transistor devices which rely upon elemental silicon nanoparticles. The silicon nanoparticles provide a set of discrete levels for electron capture with energy spacing much larger than the thermal fluctuation energy.

Silicon nanoparticles of diameter ~1 nm, have a discrete set of states resulting from the quantum mechanical wave-like nature of electrons, capable of capturing/emitting single charge carriers, with an energy spacing on the order of 1 electron volt, and a discrete set of electric charging potential energy of 0.24 eV spacing. We demonstrated single electron transport through the particles at room temperature. The I-V spectra, taken using a scanning tunneling microscope, show single electron charging effects at a spacing of ~0.26 eV. In addition, upon light irradiation, and superimposed on the charging resonances, near one hundred percent resolved single electron conductance resonance are observed with a spacing consistent with the spacing of the energy levels of the quantum dots (the nanoparticles). This development permits single electron transistors that operate at room temperatures with radiation-assistance.

The discrete set of states resulting from the quantum mechanical wave-like nature of electrons in the silicon nanoparticles is capable of capturing/emission single charge carriers. The energy is multiples of the basic unit $E=h^2/3md^2$ where m is the mass of an electron, h is Planck's constant, and d is the diameter of the particle. For the particles of the invention, d~1 nm, providing an energy spacing of 1 electron volt, five decades greater than room temperature thermal energy fluctuations (0.025 electron Volt). Only thermal fluctuations at temperatures approaching 12,000 C, more than twice the temperature on the surface of the sun, may interfere with the single electron processes in the particles. Thus, transistor devices utilizing the particles of the invention will maintain single electron processes comfortably at room temperature or any other temperature encountered under laboratory or real field conditions. Such transistor devices are truly high temperature single electronics devices.

The spacing of the energy states is a sensitive function of the diameter of the particle (quadratic dependence). For a particle of 6 nm diameter, the spacing drops to 0.027 of an electron volt. For this size, fluctuations at room temperature are equal to the energy of single electron processes. Thus, to ensure high quality operation at room temperature, sizes reasonably below 6 nm must be used. Even for 6 nm, the device must be cooled to liquid nitrogen temperature to exhibit reasonably resolved single electron processes. Thus, it is preferred that transistor devices of the invention use silicon nanoparticles having approximately 1 nm diameters.

In addition to energy discreteness provided by quantum mechanical dynamics, there is an energy discreteness due to charging potential energy. For small enough particles, the electric capacitance C will be very small such that the presence of a single electron during capture raises the electric potential, $e^2/C$, by an amount larger than the energy associated with the thermal fluctuations. In this case, single electron processes may be exhibited in terms of discrete values of the electric potential energy. The unit $e^2/C$ due to a single electron is called the Coulomb blockade.

Thus, in the concept of single electron devices there is an interplay between three energies: the quantum energy, the charging energy, and the thermal fluctuation energy. It is basically an interplay between size and temperature. The capacitance of a spherical particle $C=2\pi\epsilon d$ is proportional to the diameter d of the particle (the charging energy is inversely proportional to the diameter), whereas the quantum energy is inversely proportional to the square of the diameter. The potential energy due to the discreteness of the charge is therefore more important for larger sizes. At intermediate sizes, the two become comparable. The quantum energy dominates, however, for the silicon nanoparticles used in the present transistor. The single electron devices become operational at a given temperature if at least one of the two of these discrete systems dominate the energy of thermal fluctuation. For the transistor of the invention, the characteristic charging unit is 0.24 eV, smaller than the quantum energy (1 eV). But both are much larger than thermal fluctuation energy for room temperature (0.025 eV).

The discreetness, hence the single electron processes, are also maintained at elevated temperatures as high as 12,0000 C.

Operation of the present transistor requires assistance. The silicon nanoparticle of ~1 nm diameter is essentially non conducting because all of the electronic energy levels are filled with stationary electrons. Standard doping levels of $10^{15}/cm^3$ boron atoms allocates only $10^{-6}$ electron vacancies per particle (essentially none). Even strong doping at a level of $10^{17}/cm^3$ would be insufficient. The lack of non conductivity, however, will not hamper the operation of the high temperature device based on the single electron charging effects. Moreover, the present invention provides means to create vacancies for electrons to be captured by the quantum energy levels, rendering single electronics operational at high temperatures via both the discreteness of energy and the single electron charging. Irradiation of the silicon nanoparticles creates the necessary vacancies for single electron operation. Such operation has been experimentally demonstrated.

An experimental device, as shown in FIG. 1, was used to test the principles of the present invention. The experimental device of FIG. 1 models the action of a FET transistor using a scanning tunneling microscope 10. FIG. 1 depicts the experimental configuration where a tip 12 of the scanning tunneling microscope 10 is placed over a silicon nanoparticle film material 14 on a substrate 16 at a constant height. Silicon nanoparticles 18 contained in the film 14 are represented with an exaggerated dimension by the particle 18 in FIG. 1. In this two-terminal arrangement, the tip 12 acts as the source, while the substrate 16 acts as the drain. We probed the conductance of the particles by recording the I-V spectra of the film 14.

The FIG. 1 configuration may be represented by a double barrier model. The particles 18 represent the quantum well, with a vacuum barrier due to a gap between the particle and the tip 12, and a barrier due to a gap between the particles 18 and the substrate 16. In the experimental measurements, the tunneling current was set at 1 nA and the biasing voltage at 3V in a constant current mode, giving a tip height of several angstroms. The feedback loop was then disengaged allowing the tip 12 to be held in a constant height mode while taking the I-V spectra. While the voltage of the tip was varied with respect to the (grounded) substrate 16 from −6 to +3 volts, the tunneling current was recorded.

Figure 2:
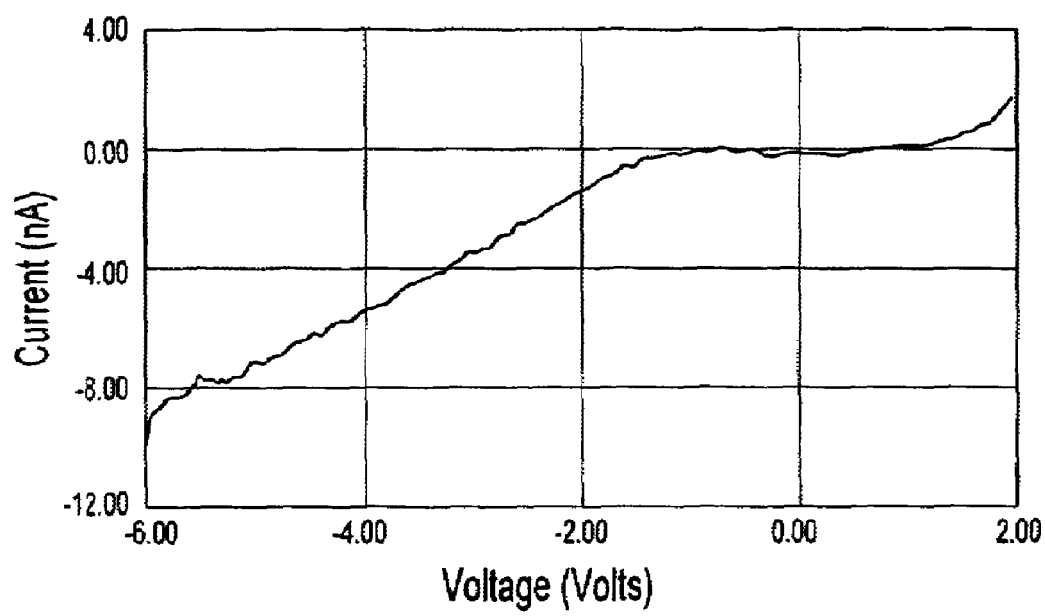
FIG. 2 is the I-V response where the tunneling current was recorded while the voltage of the tip was varied with respect to the (grounded) substrate in the range −6 to +3 eV.
Figure 3:
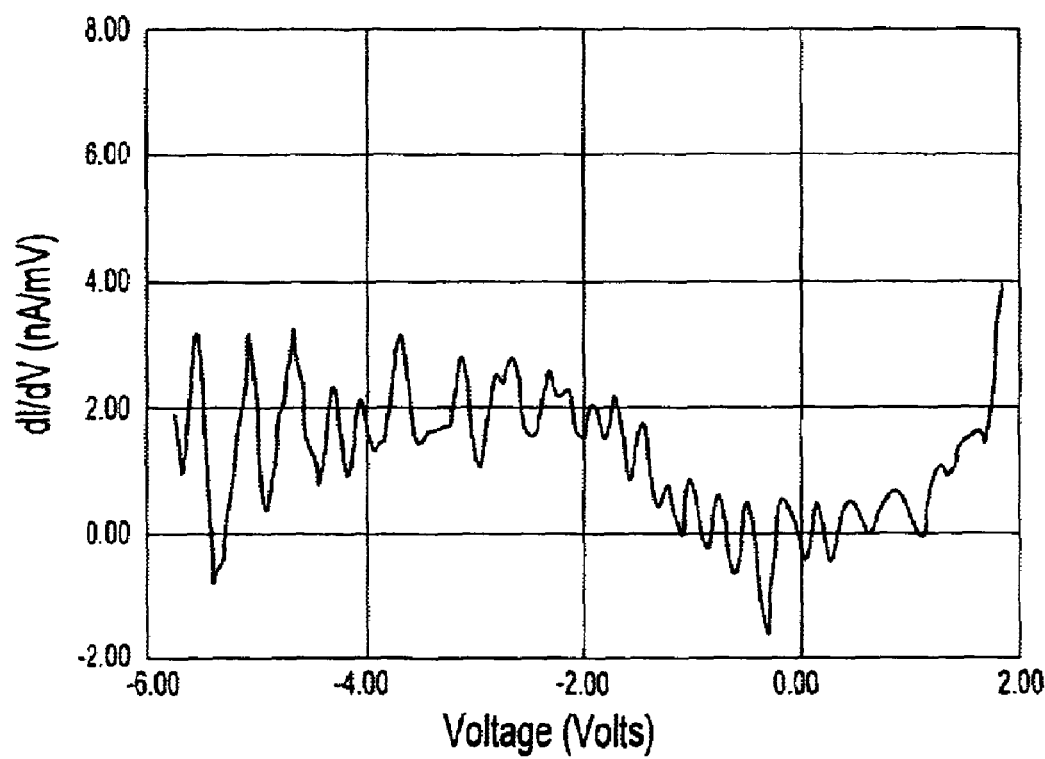
FIG. 3 gives the derivative of the I-V curve, shown in FIG. 2.
Figure 4:
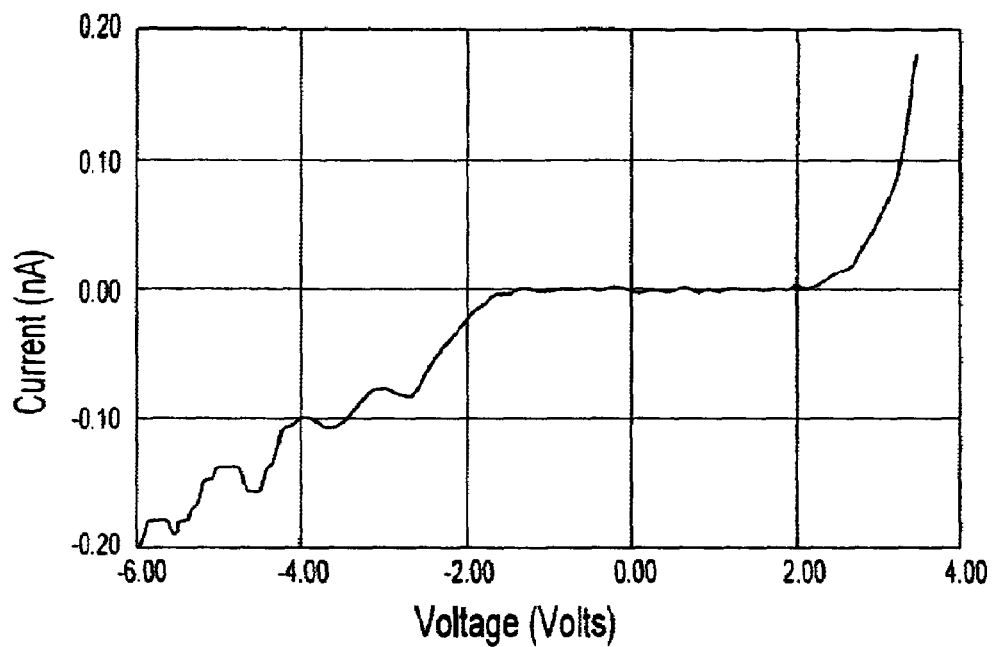
FIG. 4 is the I-V response of the experimental set up of FIG. 1, taken with the radiation from a mercury lamp.
Figure 5:
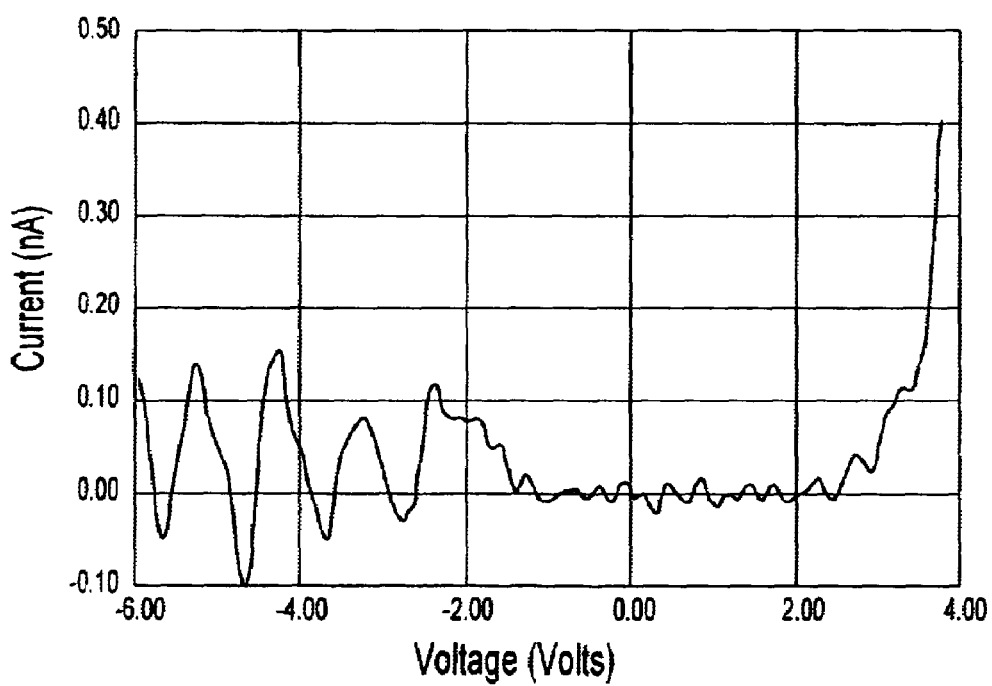
FIG. 5 is the derivative of the I-V curve of FIG. 4.

The measurement results are given in FIGS. 2–5. FIG. 2 is the I-V response where the tunneling current was recorded while the voltage of the tip was varied with respect to the (grounded) substrate in the range −6 to +3 eV with no light stimulus. The staircase due to charging is discernable, but not easily resolved. FIG. 2 gives an average of sixteen individual spectra. Averages over a larger number tend to exhibit drifts due to difficulty in maintaining a constant tip height, which may wash out the structure. FIG. 3, the derivative of the FIG. 2 I-V curve, clearly shows a progression of resonances at a spacing of 0.26 eV for both positive and negative tip biasing with respect to the substrate.

For the ultra-small silicon nanoparticles, the spacing of the energy levels, according to a standard theory of particle in a box is $E=h^2/3md^2$ which gives for d=1.1 nm, and m=the mass of an electron, an energy spacing of $\Delta=1.03$ eV. Also, the capacitance of the particles is $C=2\pi\epsilon d$, where $\epsilon$ is the permittivity of silicon which gives for d=1 nm, and $\epsilon=12\ \epsilon_0$ a capacitance of $6.7\times10^{-19}$ F. The characteristic charging due to a single electron of charge e is $\delta=e^2/C=0.24$ eV. According to theory, if the temperature is such that $kT<<\delta$, $\Delta$, as is the case in the present experiment, effects due to the discreteness of the charge (charging effect) and the discreteness of the energy spectrum (level spacing) should coexist at room or higher temperature. Because $\Delta \geq \delta$, then the $\Delta$ series should appear as a modulation of the smaller period $\delta$. However, we do not see any modulation at or close to $\Delta$, and note that the measured spacing of the steps, 0.26 eV, is consistent with the characteristic single electronic charging, hence we interpret the observed resonance structure as due to charging. Thus, the single electron device is operational based on the charging effect.

To investigate the effect of light stimulation, data was also taken with the FIG. 1 experimental set-up, with the film 14 containing nanoparticles 18 being stimulated by the light from a mercury lamp. The radiation spectral width spans the range 300 nm to 600 nm with a maximum at 350. A Pyrex glass port through which the mercury stimulation light is coupled to the vacuum system has a transmittance cutoff at 270 nm. The I-V response, shown in FIG. 4, now shows quite visibly a second regular step structure superimposed on the spectrum taken under darkness conditions with no light stimulus as in FIGS. 2 and 3. The derivative of the FIG. 4 I-V curve, shown in FIG. 5, clearly shows the progression of the resonances at large negative biasing up to a tip biasing of −1 eV with respect to the substrate, with a period of 1.0 eV, equal to the particle's quantum level spacing.

In the biasing region where both series coexist ($\leq -1$ Volt), current steps at dc voltage level obey a very simple rule: $e\eta(V_{n,k}-V_t)=\delta n+\epsilon_k$ with n=0, 1, 2, . . . is the number of electrons already residing on the dot, k=1,2, . . . designate the energy level of the dot, $\eta$ is the fraction of the capacitance of the collector from the total, $\epsilon_k$ is the energy of the kth level of the particle. The derivation of the simple expression applies for an initially empty particle, $kT<<\delta$, $\Delta$, and $E>\epsilon_f$. The step appears when the voltage aligns the Fermi level of the emitter with the kth energy level of the particle, with an account of the dot charging by n electrons already residing there. This condition gives, for $\Delta>>\delta$, a constant modulation period dominated by $\Delta$. Thus, we relate the additional modulation resonances observed to the opening of tunneling channels as the Fermi energy level of the tip is scanned across the particle's energy levels.

The light effect may simply be understood in terms of hole generation. Under standard doping levels of $\sim 10^{15}/cm^3$ boron atoms, as is typical for a wafer like that used to produce nanoparticles for experiments described herein, less than one in one million particles may contain a hole, hence there are no empty levels for the injected electrons. Practical laboratory temperature would not be sufficiently high to induce holes. Light irradiation, however, creates the necessary holes for the process to proceed.

The present observations have some interesting implications for the relative tunneling rates in and out of the silicon nanoparticles. Since the charge accumulation is observed, then $\Gamma^e$ the tunneling rate from the tip into the particles, must not be much smaller than $\Gamma^c$, the tunneling rate from the particle to the substrate. If $\Gamma^e<<\Gamma^c$ the charge is not accumulated in the particles and the only visible structure is the one related to energy quantization. Moreover, according to theory, if the energy discreteness $\Delta$ is dominant as in this case, and $\Gamma^e/\Gamma^c \leq 1$, the two fine structures also can be easily separated: the energy quantization structure with larger period modulates the charging related superfine structure with smaller period. For $\Gamma^e/\Gamma^c \geq 1$, the modulation period is increased due to charge accumulation, and equals $\Delta+2\delta$. Since the period measured for the discreteness of energy is equal to the atomic transitions, then it is concluded that $\Gamma^e$ and $\Gamma^c$ are comparable.

Figure 6:
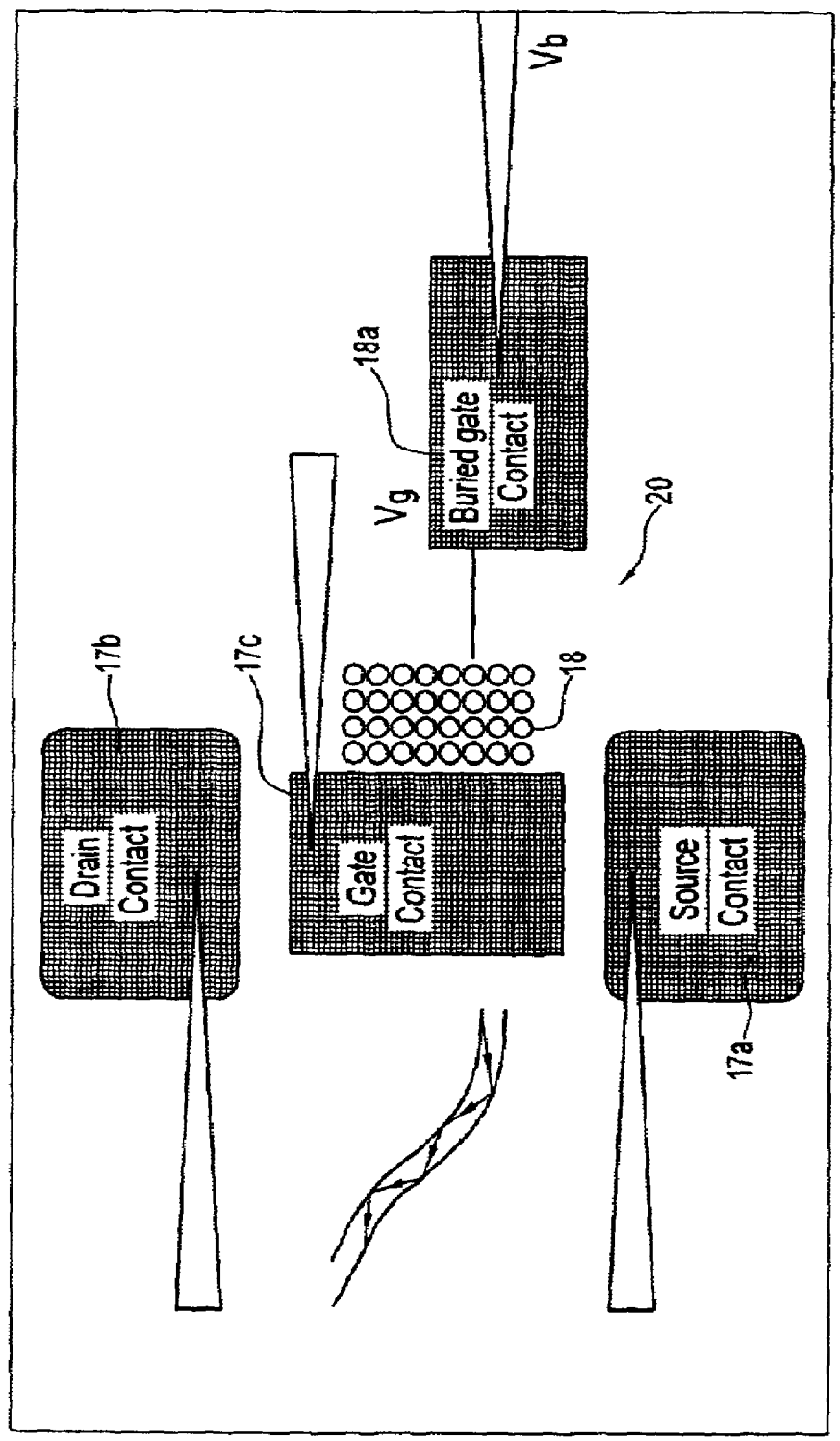
FIG. 6 is an exemplary single electron silicon nanoparticle transistor of the invention.

The data demonstrates the potential to operate radiation-assisted single electron transistors based upon the silicon nanoparticles, such as the transistor shown in FIG. 6. FIG. 6 gives a schematic of the field effect transistor with the nanoparticles implanted in the gate oxide as a buried gate. It shows the source, drain, and gate electrodes 17a, 17b and 17c, with electric leads for voltage biasing, and it shows the nanoparticle floating buried gate (shown outside the gate area for purposes of illustration). The buried nanoparticle gate 18a is connected to a voltage source, thus it can be biased independent from the source-drain-external gate, or it can be used as floating gate with no biasing. The source-drain conductance may be directly derived from the I-V characteristic measured using a precision semiconductor parameter analyzer. The characteristic are measured while the source is grounded and the drain voltage fixed at 1 mV. The source-drain conductance oscillates when the gate voltage is varied if the particle size is such that single electron charging or the quantum energy spacing dominates thermal energies. The oscillation period is the single electron charging or quantum energy spacing. In the device of FIG. 6, silicon nanoparticles 18 are implanted in the gate area 20 of a Si MOSFET as a buried gate layer. Lateral transport across the source-drain channel of the transistor, through the particles, would exhibit single electron effects as a function of the gate biasing. UV irradiation can be used to switch the single electron operation. This device may act as a dual electrical and optical device. The nanoparticles may be photo or electro stimulated to produce blue laser beams within the body of the transistor. At the same time, it will operate as a single electronics device. In addition, if tunneling from the particle gate to the substrate or drain is slowed down by providing sufficient insulators such that $\Gamma^c<<\Gamma^e$, then the transistor will act as a memory device.

Figure 7:
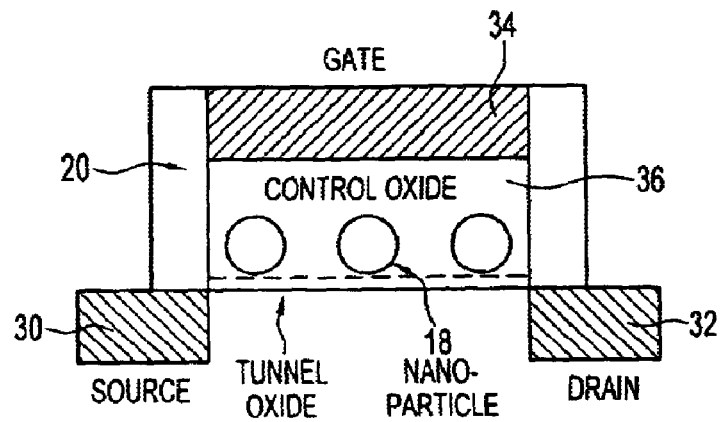
FIG. 7 is an exemplary flash memory device of the invention, depicted in cross-section.

Silicon particle floating flash memory devices operate on the use of media that store electric charge instead of using media that store magnetic effects. This requires electrical isolation of the sub elements of the media from each other and from the connection to the powering elements (source-drain). Silicon islands (particles or so called quantum dots) which are electrically floating (electrically insulated from every other element) within the volume of the insulating oxide of the gate of a field effect transistor are the backbone of this device, shown in FIG. 7. FIG. 7 is a schematic cross section of a nanoparticle memory device, showing the source 30, drain 32, and the gate 34 of the device. The silicon nanoparticles 18 are sandwiched between a thin oxide 36 of 1–2 nm thickness (tunneling oxide) that has been grown on the channel face, and a somewhat thicker control oxide (~5 to 10 nm) grown over the particles. The device of FIG. 7 offers fast-access, low-power dissipation, and possible extreme down-scaling. As the race to extreme down-scaling of device size continues to achieve faster and more efficient devices, and dense packing, it is important to develop methods for synthesis of small enough silicon floating gates (particles) to be accommodated within the gate oxide. The fabrication technology must keep up with the down-scaling, such that it will become possible for the floating gates in flash memory to be reduced to the nanometer scale, effectively behaving like quantum dots. If so, then it will be fabricated with a minimum perturbation of conventional silicon technology, and operate at room or higher temperature. The ultra-small size of the nanoparticles of the invention allows the realization of such technology.

The deposition (sandwiching) the particles in the gate oxide may be accomplished using a Si nanoparticle gun. The gun delivers the particles onto the gate area simultaneously with the deposited control oxide. The concept of the particle gun is similar to an ion beam gun used for ion implantation. The particle's energy, however, need not be as high since they are to be deposited and not implanted. In the particle gun, a colloid of the particles in a volatile liquid (such as acetone, or alcohol) is used. A jet or stream of the colloid is leaked into the system. A mechanism such as a plasma, or a radiation source is used to electrically charge the particles. The particles will then be accelerated to the required energy. A Mass filter is used for size selectivity and to reject any residual material from the solvent.

Figure 8:
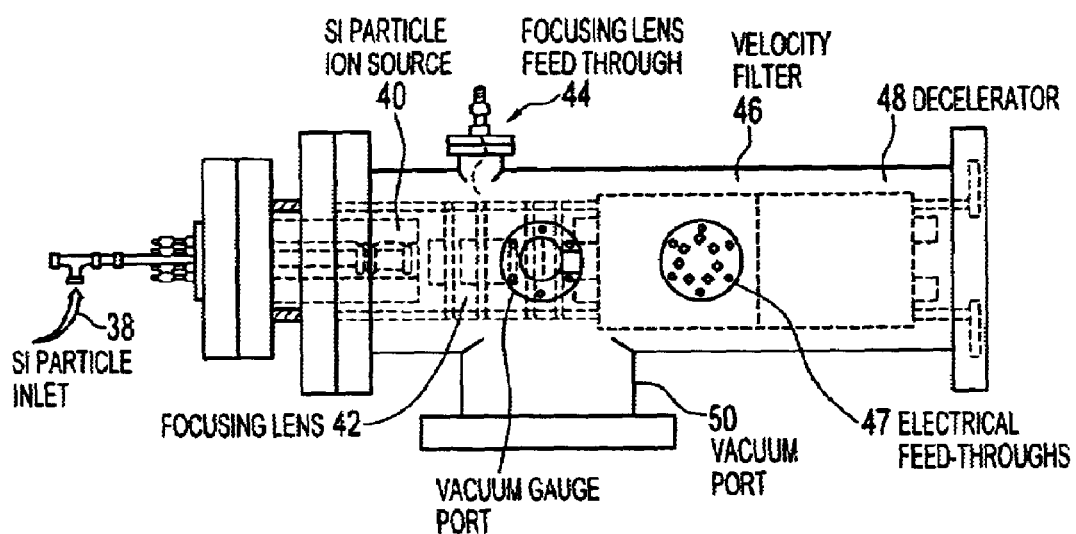
FIG. 8 illustrates a silicon nanoparticle gun.

A particle gun may be constructed as shown in FIG. 8. The gun includes a Si nanoparticle inlet 38 to deliver the particles. The inlet 38, which may be an atomizer, utilizes a colloid of the Si nanoparticles in a volatile liquid (such as acetone, water, or alcohol). A jet or stream of the colloid is shot or leaked into the Si particle ion source 40 of the gun. Most of the volatile solvent droplets will evaporate leaving the Si particles in flight. In the ion source 40, the particles get charged in their flight. The produced particle ions are accelerated (propelled) into a focusing lens 42, powered by a feedthrough electrical connection 44, where they get focused, collimated and accelerated. The accelerated particles enter into a velocity filter 46 for mass (size) selection and rejection of nonsilicon species such as residual solvent material. The velocity filter 46 is powered through a feedthrough 47 (some feedthroughs, e.g., a feedthrough for the inlet 38 are not pictured in FIG. 8 for simplicity of illustration). Mass selection is important to ensure that there is no material from the solvent in the Si nanoparticle beam. A mass selectivity of ~2/1000 can be achieved. The particle energy at the exit of the velocity filter 46 is in the range 500 to 10 keV. Finally, the particle beam enters a decelerator 48 which is capable of lowering the energy of the particles, delivering mass (size) selected particles with energies less than 500 eV (as low as 1 eV), though the deceleration 48 may be omitted if exit velocity is not a concern. Vacuum in the gun of FIG. 8 is monitored and controlled through vacuum port 50.

Figure 9A:
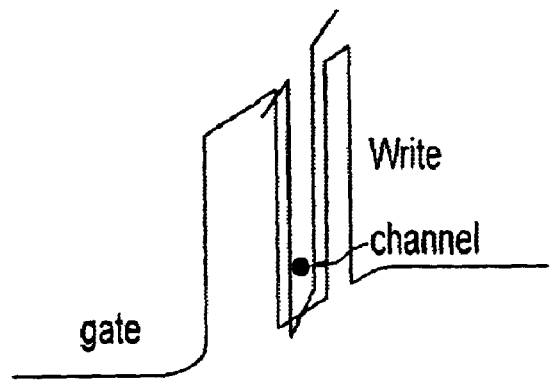
FIGS. 9a–9c depict operations of the FIG. 7 memory device.
Figure 9B:
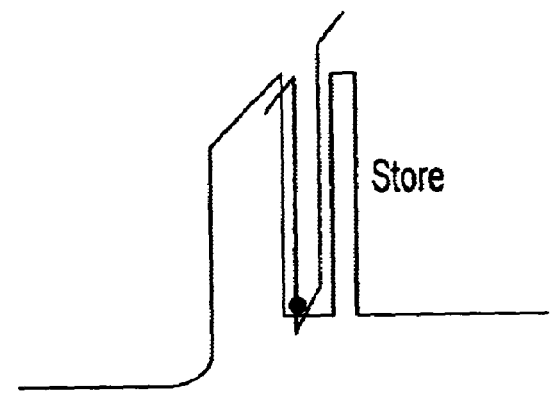
Figure 9C:
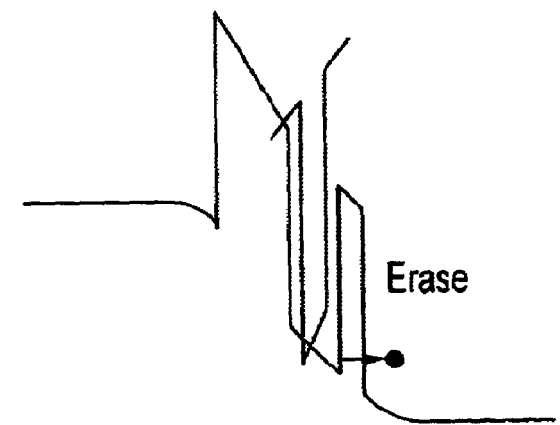

The memory device of FIG. 7 may be built by such techniques using a N-channel or a p-channel Si material. In N-channel memory where the channel is rich in excess electrons, biasing the gate positive relative to the source (grounded), and to the drain (biased at ~0.1 Volt) attracts electrons from the channel to tunnel through the thin oxide and charge the silicon nanoparticles (write step), as shown in FIGS. 9a–9b. Reversal of the charge from the silicon nanoparticles back to the channel may be achieved by reversing the polarity of the gate bias (erase step), as shown in FIG. 9c. If there is negligible lateral leakage between silicon nanoparticles and eventual dissipation in the source-drain, then long term storage of charge is attained and the obtained memory is robust. The number of charges that may be accommodated on each silicon nanoparticle depends on the size of the silicon nanoparticle and on the biasing of the gate relative to the source-drain. Large gate voltages lead to an increase in the number of stored electrons. Smaller silicon nanoparticle sizes lead to a large single electron charging, thus limiting the number of electrons.

In p-channel memory where the channel is rich in holes, biasing the gate negative relative to the source and to the drain attracts holes from the channel to tunnel through the thin oxide and charges the particles in the writing step. Erasure is achieved by reversing polarity of the gate voltage.

The effective memory threshold voltage shift that retains the charge on the particles is given by the simple expression:

$$V_T = \frac{qnt_0}{\epsilon_0} + \frac{1}{2}\frac{qnd}{\epsilon_p},$$

where n is the surface density of the nanoparticles, q is the electronic charge, $t_0$ is the thickness of the control oxide, d is the diameter of the nanoparticle, and $\epsilon_0$ and $\epsilon_p$ are the permittivities of the oxide and the particle respectively. For a particle density of $10^{12}/cm^2$, $t_0$=7 nm, and a particle diameter of 1 nm, a shift of ~0.35 eV per one electron per particle is achieved. This shift is an excellent shift since it provides a change of five orders of magnitude in the sub-threshold current of a transistor.

The ultra-small particles of the invention provide several advantages to transistor technology. First, they can be accommodated in extremely down-scaled transistors. Second, our preparation and colloid filtering, along with the mass analysis provided by the particle gun delivery system provide a high quality control on the definition and selection of the size. A narrow mass distribution (<0.25%) ensures that the discrete energy system is well defined and that the device threshold is sharp. Large variations in the size of an ensemble of particles turns the discrete spectrum into a quasi continuum and washes the device threshold. Previously, sizes smaller than 5 nm have not been achieved, and the size fluctuation exceeds 5 to 10 percent. Third, the particles are very small such that the single electron charging and the quantum energy spacing is larger than the thermal energy, thus single electron processes are in operation at room or higher temperature. Moreover, since the discrete levels are spaced out considerably, then more than one level of the particle may be utilized, namely, the particles may be operated as a multi-level memory system. Fourth, the single electron characteristic charging energy is high enough such that it limits the number of electrons that can be accommodated on each particle to one. Fifth, the use of ultra-small particles allows us to attain a larger inner particle oxide thickness for the same particle density. Thicker oxide improves the isolation of particles, hence it limits the lateral leakage further, thus improving the memory of the device. Moreover, since a thin tunneling oxide is used, the nanoparticle memory can be operated at low voltages compared to conventional flash memory. The use of a thin oxide between the particles and the silicon channel allows charging via quantum tunneling instead of hot carrier injection at higher voltages. Direct tunneling is therefore desired in the charging and discharging of the Si particles to prevent hot-carrier degradation. Finally, lower voltages mean less electrons are accommodated on particles.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A single electron transistor device comprising:
a source;
a drain;
a gate;
a buried gate layer of silicon nanoparticles; and wherein said silicon nanoparticles have a diameter of approximately 1 nm.

2. The single electron device according to claim 1, further comprising a buried gate contact to electrically stimulate said silicon nanoparticles separately from a contact to said gate.

3. The single electron device according to claim 1, wherein said silicon nanoparticles exhibit an energy spacing of approximately 1 eV.

4. A method for operating a single electron device, which has a source, a drain, a gate, and 1 nm diameter silicon nanoparticles implanted as a buried gate layer, comprising the steps of:
   creating at least one hole in the silicon nanoparticles to enable the silicon nanoparticles to conduct a single electron at room temperature across the source and the drain; and
   applying a voltage across the drain and the source.

5. The method of operating the single electron device according to claim 4, wherein said step of creating a hole in said silicon nanoparticles is accomplished by irradiating said silicon nanoparticles.

6. The method of operating the single electron device according to claim 4, wherein said step of creating a hole uses light having a spectral width between 300 nm and 600 nm.

7. A transistor memory device comprising:
   a source;
   a drain; and
   a gate, with 1 nm diameter silicon nanoparticles contained in a control oxide and separate from a tunnel oxide disposed between said source and drain.

8. A single electron device comprising:
   a source;
   a drain;
   a gate;
   a buried gate layer of silicon nanoparticles; and
   a buried gate contact to electrically stimulate said silicon nanoparticles separately from a contact to said gate;
   wherein said silicon nanoparticles have a diameter of approximately 1 nm.

9. A single electron device comprising:
   a source;
   a drain;
   a layer of silicon nanoparticles having a diameter of approximately 1 nm for conducting a single electron at room temperature across the source and the drain;
   a stimulating device to create vacancies in said layer of the silicon nanoparticles for single electron operation.

10. The single electron device of claim 9 wherein said stimulating device comprises a light irradiator for irradiating the silicon nanoparticles in said layer of silicon nanoparticles.

11. The single electron device of claim 10 wherein the light irradiator radiates light having a spectral width between 300 nm and 600 nm.

* * * * *

UNITED STATES PATENT AND TRADEMARK OFFICE
CERTIFICATE OF CORRECTION

PATENT NO. : 6,984,842 B1
DATED : January 10, 2006
INVENTOR(S) : Nayfeh et al.

It is certified that error appears in the above-identified patent and that said Letters Patent is hereby corrected as shown below:

<u>Column 4,</u>
Line 62, before "is the", delete "e" and insert -- $\epsilon$ --.

<u>Column 5,</u>
Line 28, after "$(V_{n,k} - V_t$" and before "=" insert -- ) --.

Signed and Sealed this

Thirteenth Day of June, 2006

JON W. DUDAS
*Director of the United States Patent and Trademark Office*